United States Patent
Tominaga

(10) Patent No.: US 7,050,774 B2
(45) Date of Patent: May 23, 2006

(54) AGC CIRCUIT OF AN FM RECEIVER THAT REDUCES INTERFERENCE WHILE MAINTAINING HIGH RECEPTION SENSITIVITY

(75) Inventor: Atsushi Tominaga, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 466 days.

(21) Appl. No.: 10/345,640

(22) Filed: Jan. 16, 2003

(65) Prior Publication Data
US 2003/0139157 A1 Jul. 24, 2003

(30) Foreign Application Priority Data
Jan. 22, 2002 (JP) .............................. 2002-012673

(51) Int. Cl.
H04B 1/06 (2006.01)
H04B 7/00 (2006.01)

(52) U.S. Cl. ............................... 455/232.1; 455/241.1; 455/245.2; 455/251.1; 455/253.1; 455/234.1; 375/345

(58) Field of Classification Search ................ 455/136, 455/138, 232.1, 234.1, 345.1, 241.1, 243.1, 455/245.2, 251.1, 253.1, 253.2; 375/345
See application file for complete search history.

(56) References Cited

U.S. PATENT DOCUMENTS

| | | | |
|---|---|---|---|
| 4,776,040 A | | 10/1988 | Ichikawa et al. |
| 4,872,206 A | * | 10/1989 | Graziadei et al. ......... 455/241.1 |
| 5,200,826 A | * | 4/1993 | Seong ........................ 348/731 |
| 5,867,063 A | * | 2/1999 | Snider et al. ................ 330/133 |
| 5,884,153 A | * | 3/1999 | Okada ...................... 455/243.1 |
| 6,088,583 A | * | 7/2000 | Shimizu et al. ........... 455/235.1 |
| 6,148,189 A | * | 11/2000 | Aschwanden ............. 455/234.1 |
| 6,498,927 B1 | * | 12/2002 | Kang et al. ............... 455/245.2 |
| 6,728,524 B1 | * | 4/2004 | Yamanaka et al. ........ 455/232.1 |
| 2002/0115419 A1 | * | 8/2002 | La Naour et al. ......... 455/232.1 |

FOREIGN PATENT DOCUMENTS

| | | |
|---|---|---|
| EP | 0 464 792 | 1/1992 |
| JP | 08288879 | 11/1996 |
| JP | H9-46153 | 2/1997 |

* cited by examiner

Primary Examiner—Simon Nguyen
(74) Attorney, Agent, or Firm—Brinks Hofer Gilson & Lione

(57) ABSTRACT

A first AGC voltage and a second AGC voltage are taken from the final stage of a radio-frequency circuit and the output side of a bandpass filter, respectively, and the gain of the radio-frequency circuit is controlled on the basis of the two AGC voltages. The pass-band width of the bandpass filter is approximately two times greater than the frequency interval of FM broadcast signals. The second AGC voltage is set higher than the first AGC voltage in the pass-band of the bandpass filter.

5 Claims, 4 Drawing Sheets

AGC CIRCUIT OF AN FM RECEIVER THAT REDUCES INTERFERENCE WHILE MAINTAINING HIGH RECEPTION SENSITIVITY

BACKGROUND OF THE INVENTION

1. Field of the Invention

The present invention relates to an AGC circuit of an FM receiver.

2. Description of the Related Art

A conventional FM receiver will be described below with reference to FIGS. 3 and 4. FIG. 3 shows a circuit configuration, and FIG. 4 shows input signal levels at which an AGC operation starts to take effect.

First, as shown in FIG. 3, a radio-frequency circuit 21 is composed of a variable attenuation circuit 21a to which an FM broadcast signal is input, and an input tuning circuit 21b, a radio-frequency amplification circuit 21c, and an inter-stage tuning circuit 21d that are provided downstream of the variable attenuation circuit 21a and connected to each other in cascade. The variable attenuation circuit 21a consists of a pin diode etc. The radio-frequency amplification circuit 21c is a variable gain amplification circuit.

A mixing circuit 22 is connected to the output end of the inter-stage tuning circuit 21d. A local oscillation signal for frequency conversion is supplied from an oscillation circuit 23 to the mixing circuit 22. An intermediate frequency tuning circuit 24, a first bandpass filter 25, an intermediate frequency amplification circuit 26, a second bandpass filter 27, and a third bandpass filter 28 are provided in this order downstream of the mixing circuit 22. The intermediate frequency tuning circuit 24 is a transformer (IFT), and the first to third bandpass filters 25, 27, and 28 are ceramic filters. The intermediate frequency tuning circuit 24 and the first to third bandpass filters 25, 27, and 28 have a common pass-band center frequency of 10.7 MHz. On the other hand, whereas the pass-band width of the intermediate frequency tuning circuit 24 is about 500 kHz, that of the first to third bandpass filters 25, 27, and 28 is about 200 kHz.

First and second AGC voltage generation circuits 29 and 30 are provided on the output side of the inter-stage tuning circuit 21d and the intermediate frequency tuning circuit 24, respectively. The AGC voltage generation circuits 29 and 30 output respective AGC voltages, which are both input to a superimposing circuit 31. The superimposing circuit 31 superimposes the two AGC voltages on each other. A higher one of the two AGC voltages are input to the variable attenuation circuit 21a and the radio-frequency amplification circuit 21c.

The frequency characteristic of the first AGC voltage that is output from the first AGC voltage generation circuit 29 mainly depends on the frequency characteristic of the inter-stage tuning circuit 21d, and the frequency characteristic of the second AGC voltage that is output from the second AGC voltage generation circuit 30 mainly depends on the frequency characteristic of the intermediate frequency tuning circuit 24. Whereas the frequency characteristic of the inter-stage tuning circuit 21d is broad, that of the intermediate frequency tuning circuit 24 is sharp.

Incidentally, FM broadcast signals have frequency intervals of 100 kHz. In an area where a plurality of broadcasting stations that output strong-electric-field signals exist close to each other, an interference signal occurs in the radio-frequency circuit 21 (in particular, the radio-frequency amplification circuit 21c) at a frequency that is separated from the frequency of a broadcast signal of a desired broadcasting station by about 100 kHz. To reduce the influence of such an interference signal, the level of a generated interference signal is suppressed by decreasing the gain of the radio-frequency circuit 21 by generating an AGC voltage using the interference signal. To this end, in a range of the frequency of a broadcast signal to be received plus/minus several hundreds of kilohertz (e.g., 500 kHz), with regard to AGC voltages obtained from an input signal, the second AGC voltage is set higher the first AGC voltage. The latter is set higher than the former for a signal whose frequency is out of the above range.

More specifically, as shown in FIG. 4, in the range of the frequency Fd of a broadcast signal to be received plus/minus 500 kHz, an input signal level N at which an AGC operation of the second AGC voltage starts is set lower than an input signal level W at which an AGC operation of the first AGC voltage starts. On the contrary, in the ranges that are distant from the frequency Fd by more than 500 kHz, the input signal level W at which an AGC operation of the first AGC voltage starts is set lower than the input signal level N at which an AGC operation of the second AGC voltage starts. The frequency characteristics of the input signal levels at which an AGC operation starts correspond to the frequency characteristics of the inter-stage tuning circuit 21d and the intermediate frequency tuning circuit 24, respectively.

With the above measure, an AGC operation of the second AGC voltage is performed on an interference signal occurring in a strong-electric field area whose frequency is distant from Fd by about 100 kHz, whereby the gain of the radio-frequency circuit 21 is decreased and the degree of interference is lowered. The degree of interference can further be lowered by increasing the level of the second AGC voltage and thereby decreasing the gain of the radio-frequency circuit 21 further. However, this also suppresses the level of a broadcast signal to be received that is input to the mixing circuit 22, resulting in a sensitivity failure and deterioration in noise characteristic. The level of the second AGC voltage is set in view of a tradeoff between the interference and the reception sensitivity.

For a strong interference signal whose frequency is distant from Fd by more than several hundreds of kilohertz (e.g., 500 kHz), an AGC operation of the first AGC voltage is performed.

There may occur a case that another area where a strong-electric-field broadcast signal exists whose frequency is distant from Fd by 400 kHz exists adjacent to an area where a plurality of strong-electric-field broadcasting stations exist close to each other. In this case, an AGC operation of the second AGC voltage also functions to lower the reception sensitivity of a broadcast signal to be received.

SUMMARY OF THE INVENTION

An object of the present invention is therefore to maintain reception sensitivity of a certain level or higher by preventing an event that an excessive AGC operation is caused by another FM broadcast signal whose frequency is more distant from Fd than the frequency of an FM broadcast signal that is distant from Fd by 100 kHz, and to reduce interference by an AGC operation when an interference signal is generated by an FM broadcast signal whose frequency is distant from Fd by 100 kHz.

To attain the above object, the invention provides an AGC circuit of an FM receiver, comprising a radio-frequency circuit to which an FM broadcast signal is input; a mixing circuit provided immediately downstream of the radio-frequency circuit, for converting an FM broadcast signal that is output from the radio-frequency circuit into an intermediate frequency signal; and a bandpass filter provided downstream of the mixing circuit, wherein a first AGC voltage and a second AGC voltage are taken from the final stage of the radio-frequency circuit and the output side of the bandpass filter, respectively, and the gain of the radio-frequency circuit is controlled on the basis of the first and second AGC voltages; the pass-band width of the bandpass filter is approximately two times greater than the frequency interval of FM broadcast signals; and the second AGC voltage is set higher than the first AGC voltage in the pass-band of the bandpass filter.

The bandpass filter may be a ceramic filter.

The AGC circuit may further comprises an intermediate frequency amplification circuit that is provided immediately downstream of the ceramic filter, and may be such that the second AGC voltage is taken from the output side of the intermediate frequency amplification circuit.

DESCRIPTION OF THE PREFERRED EMBODIMENT

Figure 1:
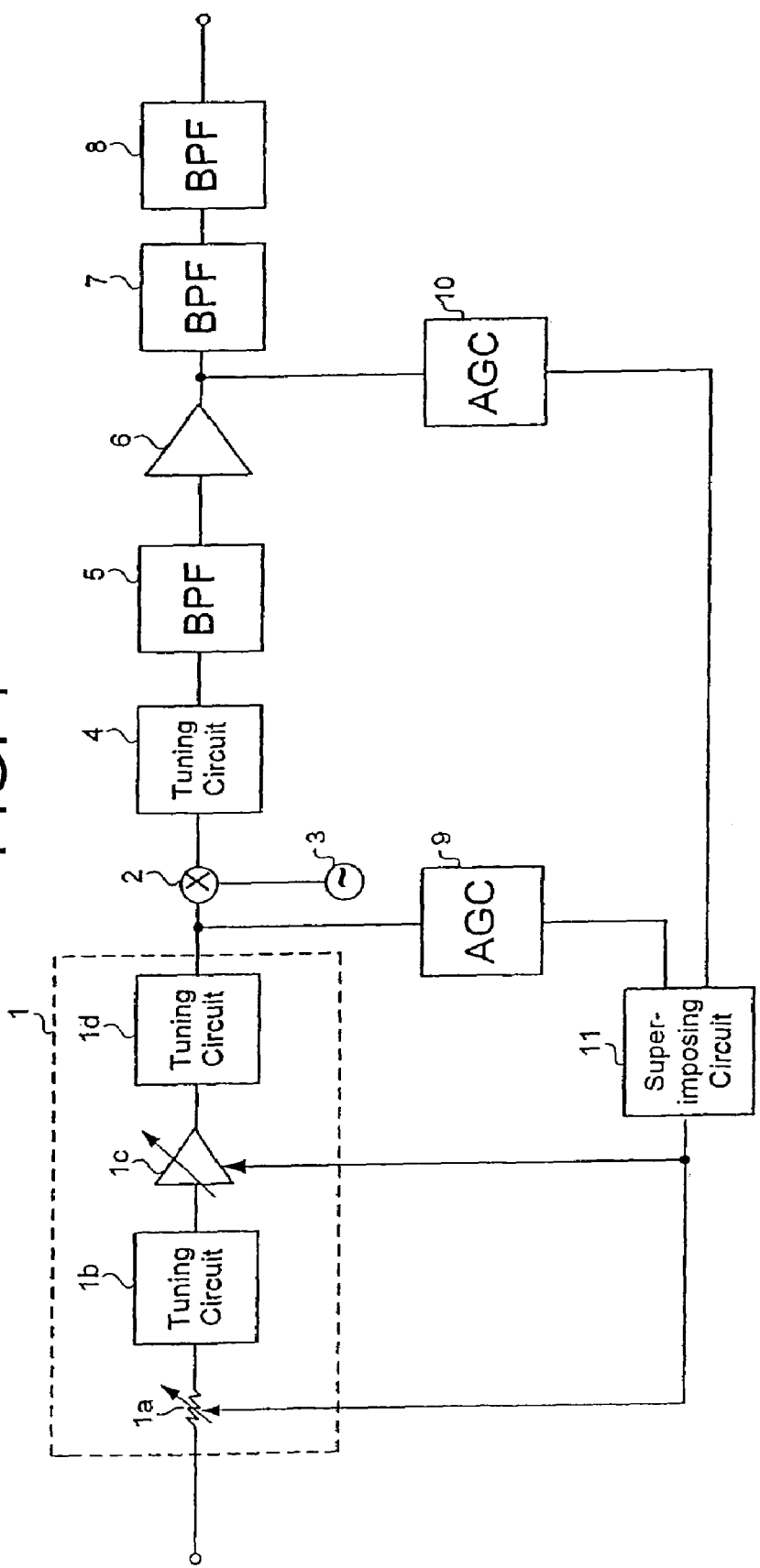
FIG. 1 is a circuit diagram showing the configuration of an AGC circuit of a conventional FM receiver according to the present invention.
Figure 2:
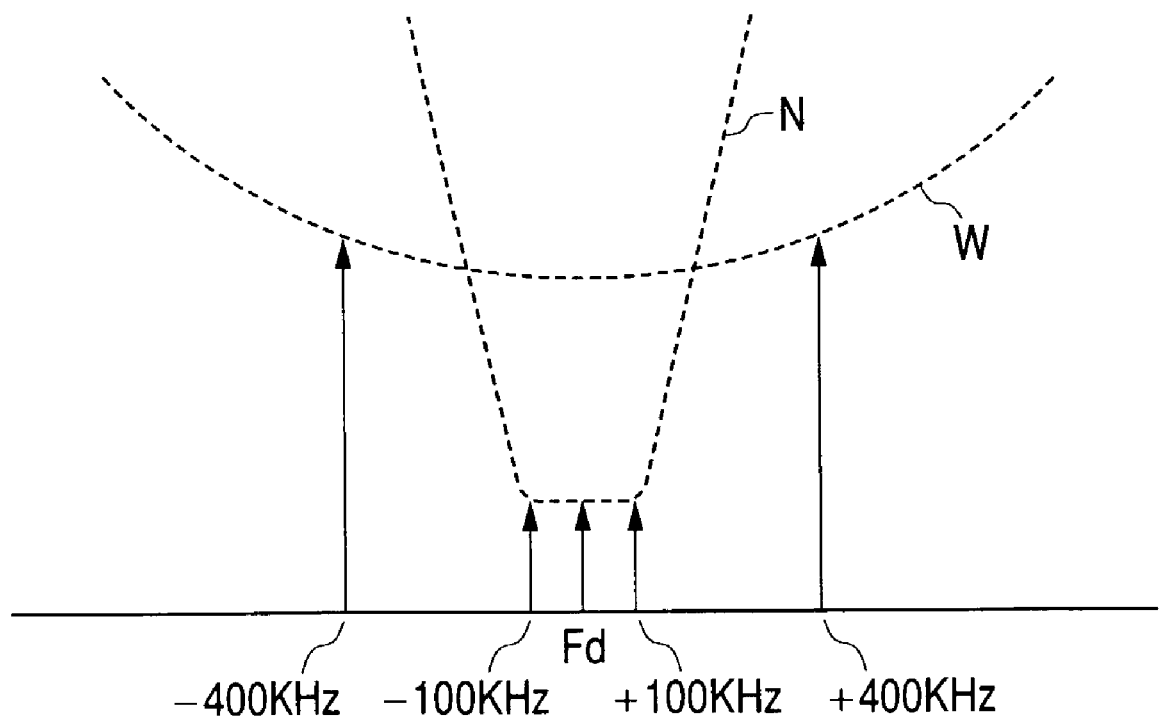
FIG. 2 is frequency characteristics of AGC voltages in the AGC circuit of the FM receiver of FIG. 1.
Figure 3:
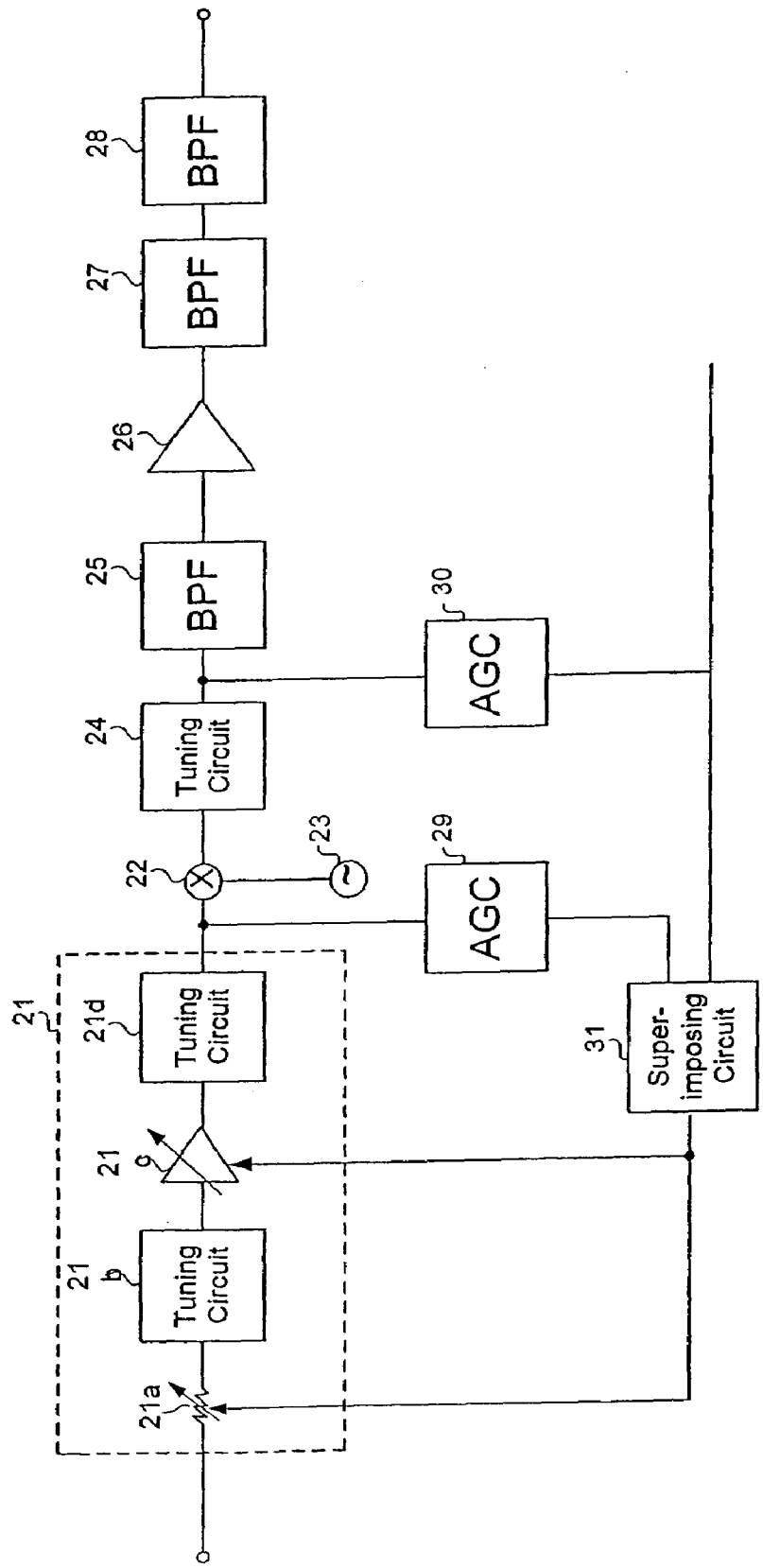
FIG. 3 is a circuit diagram showing the configuration of an AGC circuit of a conventional FM receiver.
Figure 4:
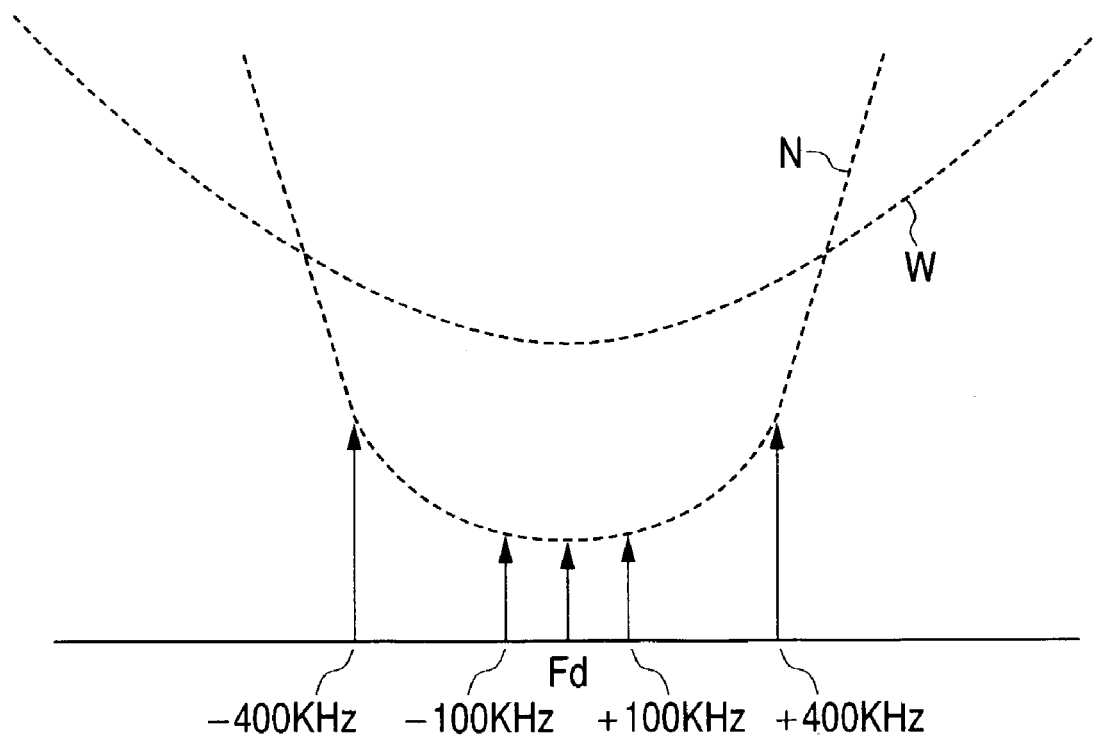
FIG. 4 is frequency characteristics of AGC voltages in the AGC circuit of the FM receiver of FIG. 3.

An FM receiver according to the invention will be described below with reference to FIGS. 1 and 2. FIG. 1 shows a circuit configuration and FIG. 2 shows input signal levels at which an AGC operation starts to take effect.

As shown in FIG. 1, a radio-frequency circuit 1 is composed of a variable attenuation circuit 1a to which an FM broadcast signal is input, and an input tuning circuit 1b, a radio-frequency amplification circuit 1c, and an inter-stage tuning circuit 1d that are provided downstream of the variable attenuation circuit 1a and connected to each other in cascade. The variable attenuation circuit 1a consists of a pin diode etc. The radio-frequency amplification circuit 1c is a variable gain amplification circuit.

A mixing circuit 2 is connected to the output end of the inter-stage tuning circuit 1d as the final stage of the radio-frequency circuit 1. A local oscillation signal for frequency conversion is supplied from an oscillation circuit 3 to the mixing circuit 2. An intermediate frequency tuning circuit 4, a first bandpass filter 5, an intermediate frequency amplification circuit 6, a second bandpass filter 7, and a third bandpass filter 8 are provided in this order downstream of the mixing circuit 2. The intermediate frequency tuning circuit 4 is a transformer (IFT), and the first to third bandpass filters 5, 7, and 8 are ceramic filters. The intermediate frequency tuning circuit 4 and the first to third bandpass filters 5, 7, and 8 have a common pass-band center frequency of 10.7 MHz. On the other hand, whereas the pass-band width of the intermediate frequency tuning circuit 4 is about 500 kHz, that of the first to third bandpass filters 5, 7, and 8 is about 200 kHz.

First and second AGC voltage generation circuits 9 and 10 are provided on the output side of the inter-stage tuning circuit 1d and the intermediate frequency amplification circuit 6, respectively. The AGC voltage generation circuits 9 and 10 output respective AGC voltages, which are both input to a superimposing circuit 11. The superimposing circuit 11 superimposes the two AGC voltages on each other. A higher one of the two AGC voltages are input to the variable attenuation circuit 1a and the radio-frequency amplification circuit 1c.

The frequency characteristic of the first AGC voltage that is output from the first AGC voltage generation circuit 9 mainly depends on the frequency characteristic of the inter-stage tuning circuit 1d, and the frequency characteristic of the second AGC voltage that is output from the second AGC voltage generation circuit 10 mainly depends on the frequency characteristic of the first bandpass filter 5. Whereas the frequency characteristic of the inter-stage tuning circuit 1d is broad, that of the first bandpass filter 5 is sharp.

Incidentally, FM broadcast signals have frequency intervals of 100 kHz. In an area where a plurality of strong-electric-field broadcasting stations exist close to each other, an interference signal occurs in the radio-frequency circuit 1 (in particular, the radio-frequency amplification circuit 1c) at a frequency that is separated from the frequency of a desired station by about 100 kHz. To reduce the influence of such an interference signal, the level of a generated interference signal is suppressed by decreasing the gain of the radio-frequency circuit 1 by generating an AGC voltage using the interference signal. To this end, in a range of the frequency of a broadcast signal to be received plus/minus several hundreds of kilohertz, with regard to AGC voltages obtained from an input signal, the second AGC voltage is set higher the first AGC voltage. The latter is set higher than the former for a signal whose frequency is distant from the frequency of a broadcast signal to be received by more than 100 kHz.

More specifically, as shown in FIG. 2, in the range of the frequency Fd of a broadcast signal to be received plus/minus 100 kHz, an input signal level N at which an AGC operation of the second AGC voltage starts is set lower than an input signal level W at which an AGC operation of the first AGC voltage starts. On the contrary, in the ranges that are distant from the frequency Fd by more than 100 kHz, the input signal level W at which an AGC operation of the first AGC voltage starts is set lower than the input signal level N at which an AGC operation of the second AGC voltage starts. The frequency characteristics of the input signal levels at which an AGC operation starts correspond to the frequency characteristics of the inter-stage tuning circuit 1d and the first bandpass filter 5, respectively.

With the above measure, an AGC operation of the second AGC voltage is performed on an interference signal occurring in a strong-electric field area whose frequency is distant from Fd by 100 kHz, whereby the gain of the radio-frequency circuit 1 is decreased and the degree of interference is lowered.

For a strong interference signal whose frequency is distant from Fd by more than 100 kHz (e.g., 400 kHz), an AGC operation of the first AGC voltage is performed. For such an interference signal, the AGC voltage is lower and hence takes effect more slowly than in the conventional case, whereby a signal to be received is suppressed less and undue reduction in sensitivity can be prevented.

Further, since the second AGC voltage is taken from the output side of the intermediate frequency amplification circuit 6, the insertion loss of the first bandpass filter 5 can be compensated for.

As described above, in the invention, a first AGC voltage and a second AGC voltage are taken from the final stage of a radio-frequency circuit and the output side of a bandpass filter, respectively, and the gain of the radio-frequency circuit is controlled on the basis of the two AGC voltages. The pass-band width of the bandpass filter is approximately two times greater than the frequency interval of FM broadcast signals. The second AGC voltage is set higher than the first AGC voltage in the pass-band of the bandpass filter. With this configuration, an AGC operation of the second AGC voltage is performed on an interference signal occurring in a strong-electric field area whose frequency is distant from the frequency of a broadcast signal to be received by 100 kHz, whereby the gain of the radio-frequency circuit is decreased and the degree of interference is lowered. For a strong interference signal whose frequency is distant from the frequency of a broadcast signal to be received by more than 100 kHz (e.g., 400 kHz), an AGC operation of the first AGC voltage is performed. For such an interference signal, the AGC voltage is lower and hence takes effect more slowly than in the conventional case, whereby a broadcast signal to be received is suppressed less and undue reduction in sensitivity can be prevented.

Where the bandpass filter is a ceramic filter, a signal whose frequency is distant from the frequency of a broadcast signal to be received by more than 100 kHz can be attenuated rapidly. An AGC operation can be performed by the first AGC voltage without the need for detecting a second AGC voltage.

Where an intermediate frequency amplification circuit is provided immediately downstream of the ceramic filter and the second AGC voltage is taken from the output side of the intermediate frequency amplification circuit, the loss of the ceramic filter can be compensated for by the intermediate frequency amplification circuit.

| ATTACHMENT A | |
|---|---|
| Guy W. Shoup | 26,805 |
| F. David AuBuchon | 20,493 |
| Gustavo Siller, Jr. | 32,305 |
| Jasper W. Dockrey | 33,868 |
| John C. Freeman | 34,483 |
| William F. Prendergast | 34,699 |
| Michael E. Milz | 34,880 |
| Tadashi Horie | 40,437 |
| Richard K. Clark | 40,560 |
| Joseph F. Hetz | 41,070 |

-continued

| ATTACHMENT A | |
|---|---|
| Jason C. White | 42,223 |
| James A. Collins | 43,557 |
| Anthony P. Curtis | 46,193 |

What is claimed is:

1. An AGC circuit of an FM receiver, comprising:
a radio-frequency circuit to which an FM broadcast signal is input;
a mixing circuit provided immediately downstream of the radio-frequency circuit, for converting an FM broadcast signal that is output from the radio-frequency circuit into an intermediate frequency signal; and
a bandpass filter provided downstream of the mixing circuit, wherein:
a first AGC circuit provided downstream of a final stage of the radio-frequency circuit and supplying a first AGC voltage, and a second AGC circuit provided at an output side of the bandpass filter immediately downstream of an intermediate frequency amplification circuit and coupled in parallel to the first AGC circuit and supplying a second AGC voltage, and a gain of the radio-frequency circuit is controlled on the basis of the first and second AGC voltages;
the bandpass filter has a pass-band width that is approximately two times greater than a frequency interval of FM broadcast signals; and
the second AGC voltage is set higher than the first AGC voltage in a pass-band of the bandpass filter.

2. The AGC circuit according to claim 1, wherein the bandpass filter is a ceramic filter.

3. The AGC circuit according to claim 1, wherein the second AGC voltage is set lower than the first AGC voltage outside the bandpass of the bandpass filter.

4. The AGC circuit according to claim 3, wherein the bandpass filter is a ceramic filter.

5. The AGC circuit according to claim 1, wherein the first AGC circuit is provided immediately downstream of the final stage of the radio-frequency circuit.

* * * * *